United States Patent [19]

Spielau et al.

[11] Patent Number: 4,550,051
[45] Date of Patent: Oct. 29, 1985

[54] LAMINATE BASED ON EPOXY RESIN FOR PRINTED CIRCUITS

[75] Inventors: Paul Spielau, Troisdorf-Eschmar; Helmut Fassbender, Bergisch-Gladbach; Richard Weiss, Troisdorf, all of Fed. Rep. of Germany

[73] Assignee: Dynamit Nobel Aktiengesellschaft, Troisorf, Fed. Rep. of Germany

[21] Appl. No.: 606,956

[22] Filed: May 4, 1984

[30] Foreign Application Priority Data

May 5, 1983 [DE] Fed. Rep. of Germany ....... 3316362

[51] Int. Cl.⁴ ........................ B32B 15/04; B32B 17/04; B32B 27/38

[52] U.S. Cl. .................................. 428/285; 428/290; 428/413; 428/415; 428/416; 428/417; 428/418; 428/901

[58] Field of Search ............... 428/413, 901, 290, 415, 428/416, 417, 273, 418, 430, 285

[56] References Cited

U.S. PATENT DOCUMENTS 4,452,847  6/1984  Siemon .......................... 428/413 X Primary Examiner—Thomas J. Herbert
Attorney, Agent, or Firm—Antonelli, Terry & Wands

[57] ABSTRACT

A laminate based on epoxy resin for printed circuits has epoxy resin-impregnated outer plies, each containing a substrate of glass fibers and epoxy resin-impregnated core plies, each containing a flat textile form or construction made of synthetic thermoplastic fibers.

12 Claims, 4 Drawing Figures

LAMINATE BASED ON EPOXY RESIN FOR PRINTED CIRCUITS

This invention relates to a laminate or multilayered composite structure based on epoxy resin for printed circuits.

Laminates for printed circuits are built up of a plurality of resin-impregnated sheets, smooth or arcuate materials, which under the effects of heat and pressure are bonded into a unit and hardened. Pressed layered composites, also called laminates, are known in various compositions of resin binder-sheet material in order to satisfy various industrial requirements with respect to physical, electrical, and chemical properties. Laminates are indispensable and have been known for a long time in modern electronics for providing printed circuits; in this connection, attention is invited to the article, for example, from "AEG-Mitteilungen" (AEG News) 49 (1959, 2/3 pp. 158–160) by Rudolf Wolf "Kupferkaschierte Schichtpresstoffe fuer die Elektrotechnik" (Copper-Laminated Pressed Layered Composites for Electrical Engineering), and to "Elektroanzeiger Essen" (Electric Advertiser) Essen, No. 18 of Sept. 28, 1966, pp. 27–30, article by Kurt Borchert "Schichtpresstoffe auf Epoxydharzbasis fuer gedruckte Schaltungen" (Laminates Based on Epoxy Resin for Printed Circuits). Lengths of glass cloth or also paper sheets are utilized primarily as the substrate materials for substrate layers for the epoxy resin. In this connection, the glass-fiber-reinforced epoxy resin laminates are the highest quality laminates; they are laminated on one side or on both sides with a metallic foil or copper or aluminum. In this regard, attention is directed, for example, to DAS No. 2,311,919; DAS No. 1,504,111; and DAS No. 2,020,587; and DOS No. 3,026,709 and German Pat. No. 2,407,923. All of the aforementioned laminates based on epoxy resin have the feature in common that in each case uniformly the same substrate material is utilized, either a glass fabric or a nonwoven glass mat or glass paper or paper or a polyester knit fabric or asbestos fibers, for the several substrate material layers; namely, for the inner plies, also called core plies, as well as for the outer layers, called outer plies.

The laminates utilizing woven glass fiber fabrics and/or glass fiber mats and/or nonwoven glass fiber fabrics exhibit, for example, the disadvantage that working of the laminates is difficult, for example by drilling and punching; nevertheless, such operations are necessary for producing the printed circuits. Therefore, efforts have been made to improve the aforementioned laminates, built up homogeneously of a single substrate material, in particular based on glass fibers, by a combination of different substrate materials, in the direction toward various features, depending on the material combination, for example, with regard to workability, as in DOS No. 2,439,152 by combining resinimpregnated glass cloths as the outer plies and resin-impregnated core plies made of paper sheets. In order to improve the properties of flexible laminates, proposals have been made to employ as the substrate material a woven fabric of a yarn, wherein the yarn comprises at least one glass fiber and at least one polyester fiber; see, for example, DOS No. 2,729,655. To improve workability, substrate layers based on glass fibers have even been entirely abandoned, and substrate plies based on synthetic fiber materials have been proposed in the form of nonwoven fabrics, such as, for example, polyester nonwoven fabrics, see DAS No. 2,031,132. Such laminates, however, exhibit low thermal stability and a lower flexural strength as compared with laminates reinforced only with glass fibers. According to DOS No. 2,726,912, the attempt has also been made to produce substrate plates for printed circuits made up of a core ply of a core-hardening plastic foam with closed cells and outer plies of resin-impregnated paper sheets or glass fiber fabrics.

The present invention is based on the object of providing a laminate employing epoxy resin with the advantages of the glass-fiberreinforced epoxy resin laminates, such as high flexural strength, surface resistance, volume resistivity, electric arc stability, blister formation resistance, bonding strength, low water absorption, low dielectric constant, low dissipation factor, and optionally nonflammability. With all these advantages, there is the drawback in glass-fiberreinforced epoxy resin laminates, on the one hand, of high costs, easy warping and/or buckling, poor workability, especially poor drilling and punching and cutting capacity, accompanied by a correspondingly great wear on the working tools. These disadvantages are based primarily on the high costs for the glass cloth reinforcement, as well as on the fact that working is made difficult on account of the high percentage proportion of glass, which is deemed necessary to obtain good physical and technical properties. In particular, the invention has as its objective to reduce the expenses for a laminate based on epoxy resin with properties approaching those of glass-fiber-reinforced epoxy resin laminates.

According to the invention, this object has been attained by means of a novel laminate construction constituting a bonded multilayered composite of resin-impregnated outer plies, containing a substrate of glass fibers with resin-impregnated core plies containing flat textile forms of synthetic thermoplastic fibers exhibiting a dielectric constant $\epsilon_r$ at 20° C. and $10^6$ Hz of smaller than 5, a dissipation factor tan $\delta$ at 20° C. and $10^6$ Hz of smaller than 0.05, and a water absorption during storage in cold water according to DIN 53 472 of smaller than 30 mg/4 d. It was found, surprisingly, that the laminate of this invention is not only considerably cheaper than pure glass-fiber-reinforced epoxy resin laminates, but it also exhibits, in particular, improved electrical properties and improved processability, with only insubstantially reduced mechanical physical property data. With respect to making the laminate more economical, the substantially lower specific gravity of the synthetic fiber nonwoven fabrics or the like turns out to be an advantage, in particular, and moreover the fact is an advantage that, with the same weight per unit area, synthetic fiber nonwoven fabrics or the like are capable of carrying a greater amount of resin than glass fiber fabrics or the like. The surprising properties of the laminate of this invention as compared with mere glass-fiber-reinforced epoxy resin laminates reside in the relatively low dielectric constant and dissipation factor, an easier and, thus, better workability; i.e., lower wear and tear on the tools, and low tendency of tearing along drilled holes and punched edges. At the same time, in spite of the use of synthetic nonwoven fiber fabrics or the like, the dimensional stability of the laminate of this invention is preserved by the outer plies based on glass fibers, and this also holds true for the surface resistance, the electric arc stability, the blister forming resistance, the bonding strength, as well as the low water absorption. It has thus been made possible, surprisingly, to provide a laminate based on epoxy resin exhibiting the good technical properties and improved electrical properties as compared with the pure glass-fiber-reinforced epoxy resin laminates, heretofore considered to be of maximum value regarding quality, and yet affording a substantial price advantage by the use of core plies based on synthetic fiber nonwoven fabrics or the like.

In the literature reference cited hereinabove, "Elektroanzeiger Essen," a detailed discussion is provided regarding laminates on epoxy resin basis with substrate materials of woven glass fabric lengths or paper sheets, the structure thereof, and the characteristic data thereof in accordance with the various standards and testing regulations. The dielectric property values of dielectric constant and dissipation factor are determined according to DIN No. 53 483 and the water absorption by storage in cold water in accordance with DIN No. 53 472.

The synthetic fibers to be utilized for the core plies in the laminate of this invention are also to be maximally temperature resistant. Using as a yardstick the Vicat softening temperature, measured according to DIN No. 53 460, method B, with a weight load of 5 kp, then it is desirable to select thermoplastic synthetic resins having a Vicat softening temperature of above 120° C., if at all possible. Exceptions in this connection are the polyacrylonitrile fibers, the Vicat softening temperature of which is lower, but, on the other hand, the high-temperature dimensional stability of which measured according to Iso/R 75, is higher than that of the thermoplastic linear polyesters.

Fibers of thermoplastic synthetic resins such as linear, saturated polyesters and/or copolyesters including polybutylene terephthalate, poly-1,6-cyclohexylene dimethyl terephthalate, polyethylene terephthalate, polyethylene terephthalate-adipate and/or polybutylene terephthalateadipate; polyimide, polyacrylonitrile, and/or styrene-acrylonitrile copolymer; polysulfone (PSU), polyether sulfone (PES) polyacrylic ether, polyphenylene sulfide (PPS), modified polyphenylene oxide (PPO) and/or polyparahydroxybenzoate; and polyoxymethylene or polycarbonate, are especially suitable for the flat textile forms. In this connection, the flat textile forms can be made up of only one fiber, or also of two different fibers; moreover, it is also possible to utilize so-called bicomponent fibers. The selection of the suitable synthetic resin depends furthermore on the solution which is the economically most favorable and most inexpensive, but, on the other hand, it may be practical to obtain, for example, laminates with high-temperature resistance having extreme electrical properties, to also use expensive synthetic resins. A preferred group of fibers are those of linear, saturated polyesters; e.g., polyethylene terephthalate, polybutylene terephthalate. A very advantageous embodiment is represented by combinations of polyethylene terephthalate and copolyesters of terephthalic acid and a second dicarboxylic acid; e.g., isophthalic acid and/or adipic acid. The copolyester can be used, for example, as a bicomponent fiber together with a polyethylene terephthalate and/or as a separate binding fiber but also in coating powder form for a flat article. The copolyesters to be selected are suppplied, in the latter case, to the flat textile article in amounts of up to 30% by weight, based on the flat article, and they are distinguished by a melting point of 190°-240° C. The flat textile forms can be fashioned as nonwoven fabrics, knit fabrics, woven fabrics, or the like, and they can be formed mechanically, thermally, and/or chemically. In case of chemical strengthening, especially suitable are binders based on polyacrylates, polyvinyl acetates, polyvinyl propionates, polyurethanes, melamine resins, urea-formaldehyde resins and/or phenolic resins. The nonwoven fabrics can be produced as spinbonded fabrics, as crimped-fiber nonwoven fabrics based on short-staple fibers which are needle-punched and additionally thermoset and/or chemically bound. It is also possible to use so-called wet-produced nonwoven fabrics which are not needle-punched.

Depending on the desired properties, it is suggested in a further development of the invention to provide that the laminate includes on the topside and underside, respectively, one outer ply with a substrate of a glass fibers, wherein at least one core ply is part of the arrangement, preferably several core plies of flat textile forms made of synthetic fibers. It is also possible, in case of increased stresses, to arrange on the topside and underside, respectively, two outer plies with a substrate having a glass fiber base. The substrates based on glass fibers which are used herein exhibit preferably a weight per unit area of about 70–350 g/m². The glass fiber woven fabrics, mats and/or nonwoven fabrics correspond with respect to quality, for example, to the qualities customarily employed for the mere glass-fiber-reinforced epoxy resin laminates for printed circuits, FR4 or CEM 3. (Standards according to NEMA) Weights per unit area of about 100–400 g/m² are suitable, in particular, for the flat textile forms prepared from synthetic fibers.

Frequently a high resin proportion is desirable for economical production of the laminates; this, likewise, becomes possible by the structure of the laminate as proposed according to the invention. A preferred embodiment of the laminates provides that the plies on a glass fiber basis having an epoxy resin impregnation with a resin content of about 40–65%, and the epoxy-resin-impregnated core plies based on synthetic fibers have a resin content of about 45–85%. The preferred range of final thickness of the laminate according to the invention is between 1.2 to 1.8 mm. The number of the core plies containing the synthetic fibers amounts between two to fifteen, depending on the thickness of the substrate and the resin content. With regard to the excellent properties of the laminate according to the invention, the weight ratio of the substrates of the synthetic fibers to the substrates of glass fibers lies between 0.5 and 6; i.e., 1:2 to 6:1.

It is desirable for some usages of the laminates for printed circuits to have a low dielectric constant, lacking in glass-fiberreinforced epoxy resin laminates. However, it is possible according to the invention for the laminate to exhibit a dielectric constant $\epsilon_r$ at $10^6$ Hz and 20° C. of smaller than 5, preferably smaller than 4. Also, the laminate according to this invention can have a dissipation factor tan $\delta$ at 20° C. and $10^6$ Hz of smaller than 0.035.

The laminates of this invention can be bonded unilaterally or bilaterally to a metallic foil, especially copper foils or also aluminum foils, optionally with the use of a suitable adhesion promoter.

The laminates according to this invention are stable in a soldering bath; i.e., they do not become subject to warping or twisting after residence in the soldering bath and on account of other treatments. Workability is improved over that of pure glass-fiber-reinforced epoxy resin laminates. Drilling, punching, and cutting are facilitated, so that also wear on tools is reduced. As compared with mere glass-fiber-reinforced epoxy resin laminates, the modulus of elasticity and the flexural strength are somewhat decreased, but are maintained at relatively high, adequate values.

Suitable epoxy resins are the epoxy resins generally known and customarily employed for laminates in electrical engineering, as heretofore described in the state of the art references. The epoxy resin can furthermore contain the usual additives, such as, for example, chlorinated phenyls, aromatic phosphates, antimony trioxide, titanium dioxide, hydrated aluminum oxide, etc. especially for flame proofing.

The epoxides (or epoxy resins) are understood to mean conventional, curable, liquid, semi-liquid, or solid resins of aromatic and aliphatic diols, such as diphenylolpropane (bisphenol A), diphenylomethane (bisphenol F), diphenolic acid, or phenols derived from cashew nutshell oil, to which are optionally added aliphatic diols and triols, with epoxides such as epichlorohydrin or dichlorohydrin, if desired with the addition of reactive diluents, with molar ratios of the diols to the epoxides of about 1:1 to 1:2, which can be cured with the aid of amines, especially tertiary amines, such as piperidine, benzyldimethylamine, m-phenylenediamine, diethyl- or dimethylaminopropylamine, tris(dimethylaminomethyl)phenol, diethylenetriamine, dicyandiamide, and others, or anhydrides of polybasic acids, such as phthalic anhydride, pyromellitic anhydride, dodecenylsuccinic anhydride, and others. Chlorinated and especially brominated epoxy resins are likewise used with success. Solvents and/or other reactive or also nonreactive diluents can likewise be used to obtain the suitable viscosity during impregnation. Furthermore, a catalyst, an activator and/or hardener or a crosslinking agent should also be provided to make it possible for the epoxy resin to initially enter the meltable B-state and later on to pass over into the unmeltable C-stage.

Aromatic diamines and dicyandiamide are predominantly employed as the curing agents, since the hydrogen atoms of the amino groups in these compounds readily react with the epoxy groups with controllable crosslinking and formation of macromolecules.

It is also possible to add to the epoxy resin solution agents imparting flexibility, for example, nitrile rubber, acrylonitrile-butadiene copolymers, and others, in proportions of up to 30 parts by weight of unmodified epoxy resin. Suitable mixtures are described, for example, in German Pat. No. 2,407,923.

The laminates are generally produced by saturating the fiber layer with impregnating solution. This can be done by spreading, for example, with a roll, by spraying, or by dipping. In continuous processes, the layer is advantageously conducted through an impregnating bath in the one-stage method, or also in the multistage procedure. Thereafter, drying and condensation of the synthetic resin are conventionally carried out, for which purpose a drying tunnel is advantageously employed. The thus-obtained prepregs are subjected to a final curing step in a heating press in a manner known, per se, using a pressure of 15–80 bar and temperatures in the range from 140° to 180° C., preferably about 160°–170° C., with pressing periods of 30–90 minutes.

Among the flat textile forms of synthetic fibers to be substantially utilized for the invention, preferred by far are the polyester fibers for financial reasons because of their widespread availability. In contrast thereto, polyimide fibers and fibers of other especially high-temperature resistant synthetic resins, such as PSU, PPO, PES, PPS, due to their high price, are suitable especially for special applications or in processing with less expensive polyester fibers, for example. Flat textile forms which can be readily impregnated and carry a large quantity of resin are preferred, for example knit fabrics or stitched knit-bonded fabrics. The viscosity of the epoxy resin is set to be low for impregnating purposes, especially in the range from 15–30 seconds of efflux time, measured in a Ford beaker with 4 mm nozzle, for example, by adding low-boiling solvents, such as acetone, butanone, ethyl alcohol, or the like. A drying process follows the impregnating step, including prehardening of the impregnating resin. During the subsequent lamination of the core plies and outer plies with the use of pressure and heat, either continuously or discontinuously in presses, wherein simultaneously a metal foil can be laminated to one or both sides, curing of the impregnating resin and uniform bonding are then effected. The manufacturing process for the laminate of this invention is analogous to the conventional methods for the production of glass-fiber-reinforced epoxy resin laminates. However, it has been found that, as compared with pure EPG=epoxy glass laminates, rather somewhat lower bonding pressures are required. Surprisingly, the manufacturing process is, likewise, facilitated for the reason that even with a stronger densification of the individual core plies; i.e., with a relatively low remaining resin flow, it is still possible to effect perfect bonding by pressure to form the laminate, without delamination.

BRIEF DESCRIPTION OF THE DRAWINGS

The invention is illustrated in the drawing with reference to its embodiments. In the drawing.

Figure 1:
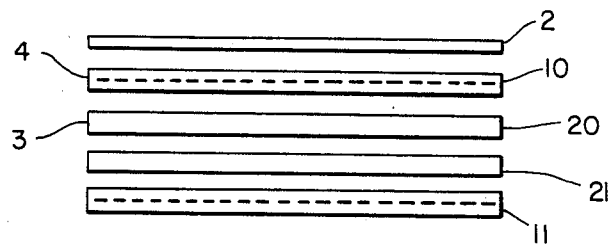
FIG. 1 shows schematically the individual plies of a laminate in a lateral view.

A laminate according to this invention is composed of plies impregnated with an epoxy resin. According to FIG. 1, the outer plies 10, 11 of the laminate are made up of, for example, glass fiber fabrics, knitwork, mats, or the like glass fiber containing substrates 4, saturated with epoxy resin and preimpregnated, and the core plies 20, 21 are constituted of synthetic nonwoven fiber fabrics, knit fiber fabrics, woven fiber fabrics, or the like flat textile forms 3, impregnated with the same epoxy resin as the outer layers.

Figure 2:
FIG. 2 shows the finished laminate.

The epoxy resin impregnation for the core plies can be additionally enriched, for example, with fillers, such as antimony trioxide, titanium dioxide, kaolin, talc and/or chalk. This laminate arrangement can furthermore be bonded on one side or on both sides to a metallic foil 2, for example, a copper foil. FIG. 2 shows a cross-sectional view of the laminate 1, produced, for example, in a multiplaten press with the use of pressure and heat from the plies according to FIG. 1.

Figure 3:
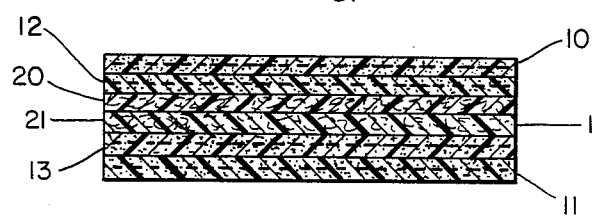
FIGS. 3 and 4 show two other versions of differently constructed laminates in cross section.

FIG. 3 shows by way of example a cross-sectional view of another structure of a laminate 1 of this invention wherein, respectively, two outer plies 10, 12 on the topside and 11, 13 on the underside are provided, of woven glass fiber fabric 4 impregnated with epoxy resin, and two core plies are included made up of nonwoven fabrics 3 impregnated with epoxy resin, for example, nonwoven polyester fiber fabrics.

Figure 4:

FIG. 4 shows a simple structure of a laminate 1 with, respectively, one outer ply 10, 11 made of glass fiber fabric impregnated with epoxy resin, and a core layer made of a nonwoven synthetic fiber fabric 20, impregnated with epoxy resin, for example, a polyester fiber nonwoven fabric or a nonwoven fabric of polyacrylonitrile fibers or polyimide fibers.

The invention will be further described with reference to several examples.

EXAMPLES 1-5

Cover plies were produced by impregnating a woven glass fiber fabric, 200 g/m², with epoxy resin, resulting in a glass fiber content to epoxy resin content of 60:40 after predrying and densifying. Then core plies were produced by impregnating a nonwoven polyester fiber fabric of 200 g/m², made up of fibers based on polyethylene glycol terephthalate and copolyester fibers of terephthalic acid and adipic acid and glycol, with the same epoxy resin as the cover plies, thus obtaining a resin content of 63% after drying and preliminary densification.

An epoxy resin IEC 249 by Dynamit Nobel AG was employed, diluted in acetone methyl glycol according to the following recipe:

| | Parts by Weight |
|---|---|
| Resin Glycidylether of Brominated Bisphenol A | 93.8 |
| Benzyl Dimethylamine | 0.2 |
| Dicyandiamide | 4.0 |
| Antimontrioxyde | 2.0 |
| Acetone Methyl Glycol (5:1) | 80 |

For Example 1, respectively, one cover layer of glass fiber/epoxy of the top and on the bottom with three core plies of polyester/epoxy were compressed under normal operating conditions for EPG laminates of about 160°-170° C. for a period of 60 minutes under approximately 60 bar.

For Example 2, respectively, two cover layers of glass fiber/epoxy on the top and on the bottom with two core plies of polyester/epoxy; for Example 3, respectively, one cover ply of glass fiber/epoxy on the top and on the bottom with two core plies of polyester/epoxy were pressed under the same conditions as Example 1.

For Comparative Example 4, five core plies of polyester/epoxy were pressed under the same conditions as Example 1.

For Comparative Example 5, eight cover plies of glass fiber/epoxy were pressed under the same conditions as Example 1, resulting in the standard quality of an epoxy glass laminate EPG 9020 by Dynamit Nobel AG. The extraordinarily astonishing results of an evaluation of the properties for the laminates of this invention can be seen from Table 1 below.

TABLE 1

| Property | Rated Value According to Standard FR4 | Examples | | | Comparative Examples | |
|---|---|---|---|---|---|---|
| | | 1 | 2 | 3 | 4 | 5 |
| Thickness (mm) | | 1.7 | 1.6 | 1.22 | 1.95 | 1.5 |
| Density (g/ml) | | 1.43 | 1.55 | 1.51 | 1.39 | 1.89 |
| Soldering Bath Stability (sec) at 260° C. According to DIN-IEC 52 | >20 | >180 | >180 | >180 | 60 | >180 |
| Modulus of Elasticity (N/mm²) Longitudinal | 18,000 | 14,800 | 22,400 | 18,700 | 4,000 | 20,000 |
| Flexural Strength (N/mm²) Longitudinal | 350 | 350 | 490 | 400 | 114 | 420 |
| Dissipation Factor tan δ at $10^6$ Hz · $10^{-4}$ After Climatized Storage for 96 h at 40° C. and 92% Relative Atmospheric Humidity DIN 53 483 | <350 | 243 | 242 | 250 | 303 | 380 |
| Dielectric Constant $\epsilon_r$ at $10^6$ Hz According to C 96/40/92 DIN 53 483 | <5.5 | 3.9 | 4.1 | 3.8 | 3.7 | 4.5 |
| Flammability According to UL 94 (sec) | <10 | 10.3 | 7.5 | 10.1 | 12.5 | 4-7 |
| Punching Resistance, Needle 1 mm (N) | | 390 | 480 | 330 | 420 | 600 |

EXAMPLES 6-14

In the following examples, woven glass fiber fabrics of 200 g/m², impregnated with epoxy resin to a content of 40% by weight of epoxy resin: 60% by weight of glass, were laminated in various layer arrangements with various synthetic resin fiber nonwoven fabrics or woven fabrics, likewise impregnated with the epoxy resin, as described in Example 1. The structure and the property values can be seen from Table 2.

The following nonwoven/woven fabrics were utilized (percent by weight of epoxy resin after drying and preliminary densification):

A polyester knits of 160 g/m², impregnated to 67% by weight of epoxy resin,

B polyacrylonitrile nonwoven fabric with melamine resin binder (needle-punched random-fiber mat), 150 g/m², impregnated to 85% by weight of epoxy resin, C polyester nonwoven, flame-retardant, of TREVIRA CS ® by Hoechst, a needle-punched random-fiber mat of 285 g/m², impregnated to 75% by weight of epoxy resin.

TABLE 2

| Example | Cu Foil 35μ | Number Top Cover Plies EPC | Number Core Plies of Fabric | Number Bottom Cover Plies EPG | Soldering Bath Stability 265° C. (sec) | Flammability in sec to Extinction |
|---|---|---|---|---|---|---|
| 6 | — | 1 | 3A | 1 | >120 | 4.7 |
| 7 | 1 | 1 | 4A | 1 | >120 | 3.4 |
| 8 | — | 2 | 2A | 2 | >120 | 3.4 |
| 9 | — | 2 | 1B | 2 | 43 | 16 |

TABLE 2-continued

| Example | Cu Foil 35μ | Number Top Cover Plies EPC | Number Core Plies of Fabric | Number Bottom Cover Plies EPG | Soldering Bath Stability 265° C. (sec) | Flammability in sec to Extinction |
|---|---|---|---|---|---|---|
| 10 | — | 1 | 2B | 1 | 60 | 29 |
| 11 | — | 2 | 1C | 2 | >120 | 2.3 |
| 12 | 1 | 2 | 1C | 2 | 120 | 2.0 |
| 13 | 1 | 1 | 2C | 1 | >120 | 1.9 |
| 14 | 1 | 1 | 2C | 1 | >120 | 1.8 |

What is claimed is:

1. A laminate based on epoxy resin for preparation of printed circuits, which comprises a multilayered composite having epoxy resin-impregnated, outer plies containing a substrate of glass fibers and at least one epoxy resin-impregnated core ply containing a flat textile form of synthetic thermoplastic fibers, each substrate containing glass fibers having a weight per unit area of 70–350 g/m² and each flat textile form containing synthetic thermoplastic fibers having a weight per unit area of about 100–400 g/m²; said composite having a dielectric constant $\epsilon_r$ at 20° C. and $16^6$ Hz of smaller than 5, a dissipation factor tan δ at 20° C. and $10^6$ Hz of smaller than 0.05, and a water absorption when stored in cold water according to DIN 53 472 of smaller than 30 mg/4 d; the outer plies containing a substrate of glass fibers having an epoxy resin content of about 40 to 65% by weight and the at least one core ply containing a flat textile form having an epoxy resin content of about 45–85% by weight.

2. A laminate according to claim 1, wherein the flat textile form contains fibers of linear, saturated polyesters and/or copolyesters comprising polybutylene terephthalate, poly-1,6-cyclohexylene dimethyl terephthalate, polyethylene terephthalate, polyethylene terephthalateadipate and/or polybutylene terephthalate-adipate.

3. A laminate according to claim 1, wherein the flat textile form contains fibers of polyimide.

4. A laminate according to claim 1, wherin the flat textile form contains fibers of polyacrylonitrile and/or styrene-acrylonitrile.

5. A laminate according to claim 1, wherein the flat textile form contains fibers of polysulfone, polyether sulfone, polyacrylic ether, polyphenylene sulfide, modified polyphenylene oxide and/or polyparahydroxybenzoate.

6. A laminate according to claim 1, wherein the flat textile form contains fibers of polyoxymethylene of polycarbonate.

7. A laminate according to claim 1, wherein, respectively, one outer ply with a substrate of woven glass fiber fabric and/or nonwoven glass fiber fabric and/or glass fiber mat is arranged on the topside and on the underside of said composite.

8. A laminate according to claim 1, wherein, respectively, two outer plies with a substrate of woven glass fiber fabric and/or nonwoven glass fiber fabric and/or glass fiber mat are arranged on the topside and on the underside of the composite.

9. A laminate according to claim 1, wherein said composite exhibits a dielectric constant $\epsilon_r$ at $10^6$ Hz and 20° C. of smaller than 5, preferably smaller than 4.0.

10. A laminate according to claim 1, wherein a conductive metallic foil is bonded to at least one of the outer glass fiber plies of said composite.

11. A laminate according to claim 1, wherein the composite has a plurality of core plies containing the synthetic fibers in an amount between 2 to 15.

12. A laminate according to claim 1, wherein the weight ratio of the at least one core ply of synthetic fibers to the outer plies of the glass fibers lies between 0.5 and 6.

* * * * *